(12) United States Patent
Steiger

(10) Patent No.: US 7,472,000 B2
(45) Date of Patent: Dec. 30, 2008

(54) SENSOR, CONTROLLER AND METHOD FOR MONITORING AT LEAST ONE SENSOR

(75) Inventor: Eckard Steiger, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 210 days.

(21) Appl. No.: 10/521,694

(22) PCT Filed: Feb. 20, 2003

(86) PCT No.: PCT/DE03/00526

§ 371 (c)(1),
(2), (4) Date: Jan. 18, 2005

(87) PCT Pub. No.: WO2004/017215

PCT Pub. Date: Feb. 26, 2004

(65) Prior Publication Data

US 2005/0252709 A1 Nov. 17, 2005

(30) Foreign Application Priority Data

Aug. 1, 2002 (DE) ................................. 102 35 161

(51) Int. Cl.
*G06F 7/00* (2006.01)
*G06F 19/00* (2006.01)

(52) U.S. Cl. ............................. 701/34; 701/29; 701/35; 701/45; 340/438; 340/539.24; 180/268; 180/271; 702/182; 702/183; 702/185; 700/79

(58) Field of Classification Search ................ 701/34, 701/45, 29, 35; 180/268, 271; 340/438, 340/539.24; 700/79; 702/182, 183, 185
See application file for complete search history.

(56) References Cited

U.S. PATENT DOCUMENTS

| 4,422,073 | A | * | 12/1983 | Winner | 340/870.21 |
| 4,464,653 | A | | 8/1984 | Winner | |
| 5,517,102 | A | * | 5/1996 | Jensen | 318/701 |
| 5,809,437 | A | * | 9/1998 | Breed | 701/29 |
| 5,971,432 | A | * | 10/1999 | Gagnon et al. | 280/735 |
| 6,115,654 | A | * | 9/2000 | Eid et al. | 701/34 |
| 6,122,577 | A | * | 9/2000 | Mergenthaler et al. | 701/34 |
| 6,144,904 | A | * | 11/2000 | Tseng | 701/34 |
| 6,434,476 | B1 | * | 8/2002 | Zagone | 701/115 |
| 6,721,639 | B2 | * | 4/2004 | Raypole et al. | 701/34 |
| 6,741,919 | B1 | * | 5/2004 | Schuster et al. | 701/34 |
| 6,759,844 | B2 | * | 7/2004 | Kliemannel | 324/251 |

FOREIGN PATENT DOCUMENTS

| DE | 31 21 645 | 12/1982 |
| EP | 0 745 864 | 12/1996 |
| WO | WO 98 20615 | 5/1998 |

* cited by examiner

*Primary Examiner*—Jack W. Keith
*Assistant Examiner*—Chuong P Nguyen
(74) *Attorney, Agent, or Firm*—Kenyon & Kenyon LLP

(57) ABSTRACT

A sensor having a sensor element, and a control unit having a processor, and a method for monitoring at least one sensor, are proposed. A fault pattern is generated within the sensor and is transmitted from the sensor to the control unit in order to enable an appropriate response to the fault pattern by the processor. The fault pattern is preferably transmitted in an eight-bit word. In addition to faults, unusual operating states are also transmitted.

20 Claims, 1 Drawing Sheet

SENSOR, CONTROLLER AND METHOD FOR MONITORING AT LEAST ONE SENSOR

FIELD OF THE INVENTION

The invention generally relates to a sensor and a control unit and a method for monitoring at least one sensor.

SUMMARY OF THE INVENTION

The sensor according to the present invention and control unit according to the present invention and method for monitoring at least one sensor according to the present invention having the features of the independent claims have the advantage that a differentiated fault pattern can be transmitted with a specific fault message to the system—i.e. to the control unit—and an appropriate reaction can occur, while preventing every fault in a sensor from having the consequence that the sensor signal as a whole must not be used, or that the system identifies a permanent sensor fault and therefore a system defect. Disruptions that do not denote lasting sensor damage, and possibly are even attributable to infrequent but possible operating states, can therefore be not too severely punished. Examples of this are the incoupling of electromagnetic interference, and vibrations due to hammer blows. The performance or sensitivity of the system is thereby improved, and the probability of a control unit field failure is reduced. The invention in particular makes it possible, with adaptation and application to the respective target control unit and vehicle, to react better to specific differing system requirements and customer requirements in terms of triggering parameters and fault management.

This allows on the one hand an increase in the performance and robustness of the overall system, and on the other hand a reduction in field failure fates, since with the more in-depth fault pattern detection not all fault patterns must be deemed total failures. The invention is additionally advantageous because fault discovery and optimization can be facilitated in the development and testing phase of a restraint system. Application of the invention is also possible and advisable, however, in other automotive sectors in which sensors are used, in particular in vehicle dynamics control and in navigation.

It is particularly advantageous that the status bits indicating the fault modes are constituted from different sensor-internal monitoring mechanisms, and remain in existence only until a conclusion is drawn as to the operating state belonging to the fault state. The time information for each individual fault mode is thus also usable for system-side application of the sensor. This permits an accurate analysis of the fault, achievable using a so-called look-up table. The fault pattern transmitted from the sensor to the control unit can then be evaluated accordingly in the processor of the control unit. It is thereby possible, in particular, for the control unit to detect whether the fault is permanent and how serious the fault is.

It is especially advantageous that the fault pattern is transmitted digitally in an eight-bit word, here given the abbreviation MONI, in a 16-bit frame. The MONI word can have different fault indications written to it using different read instructions. The number of transmittable fault modes can thereby be increased. In this word, the fault type or modes are identified by flags. A variety of fault modes and unusual operating states that have been detected are thus indicated by way of this word. Fault modes indicate that at least one sensor operating parameter is outside a predefined range.

In the context of this monitoring, advantageously at least one phase-lock loop of the sensor and/or at least one control voltage is monitored in terms of a predefined range, and/or the output values of at least one analog/digital converter are monitored in terms of a predefined range, and/or the input and/or output values of at least one digital/analog converter are monitored in terms of a predefined range, and/or the dynamic limits of at least one capacitance/voltage converter are monitored in terms of a predefined range, and/or at least one offset controller is monitored in terms of a predefined range, and/or at least one common-mode controller is monitored in terms of departure from a predefined range, and/or at least one variable representing a sensor oscillation is monitored in terms of a predefined range, and/or impermissible values of at least one counter are monitored as defined. When a fault or an unusual operating state is detected, a respective value is set in a respective register, i.e. a fault register is occupied by a logical "1". When that fault or unusual operating state is no longer detected, the respective register is then reset, i.e. a logical "0" is once again set.

When at least one value that denotes a fault is set to "1", another value is also set to one. This makes it possible to indicate, by way of a single bit or flag, whether any sensor-internal fault has been identified. This flag is transmitted as status information along with every regular sensor output value transmission. If necessary, i.e. in the event the summarizing value indicates a fault state, the detailed fault pattern can then be requested by way of the available read instructions. This procedure of requesting as necessary saves transmission and processing capacity. The allocation of read instructions numbered 1, 2, etc. to the fault information is defined in the MONI word. Two read instructions are used here, i.e. two eight-bit words of fault information can be indicated.

It is additionally advantageous that the sensor itself is disposed inside the housing of the control unit. SPI (serial peripheral interface) lines are then preferably used to interconnect the sensor (via the digital interface) and the processor of the control unit.

BRIEF DESCRIPTION OF THE DRAWINGS

The present invention will be described in greater detail with reference to the following drawings wherein.

DETAILED DESCRIPTION OF THE INVENTION

Figure 1:
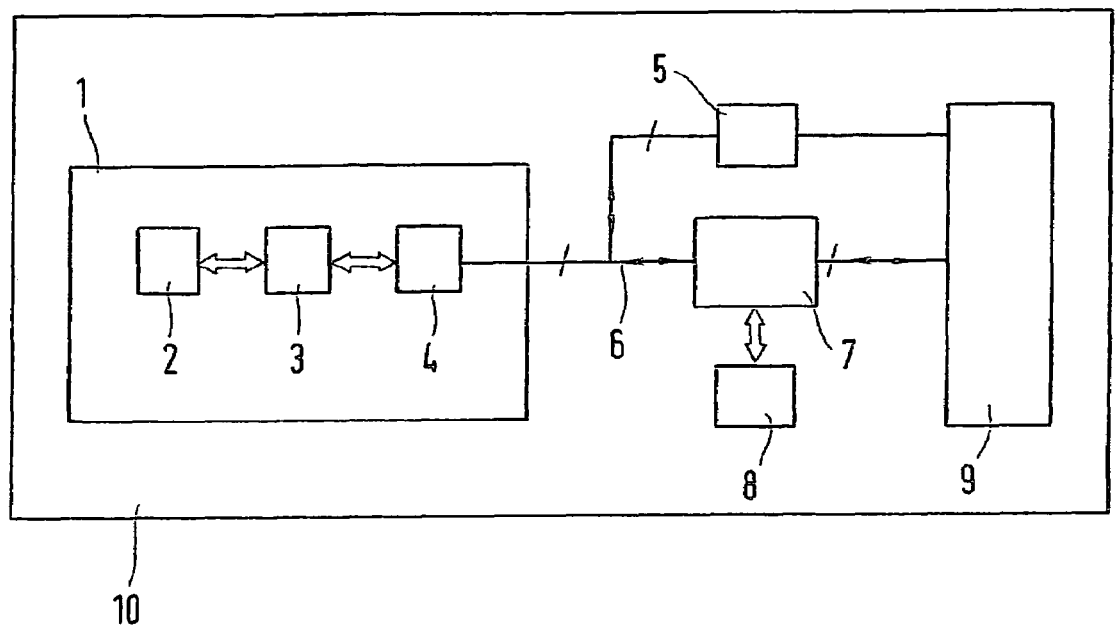
FIG. 1 shows a block diagram of the sensor according to the present invention in a control unit according to the present invention.

Rotation rate sensors, like other sensors as well, are being used more and more in electronic restraint systems for passive vehicle safety. Rotation rate sensors are core components for the detection of rollover processes and related accident processes, for example soil trip.

Some of the sensors used in restraint systems possess a sensor-internal monitoring function. A fault or malfunction state resulting from a wide variety of causes can, when it is identified, be reported by way of a logical signal (fault, no fault), in a context of analog sensor interfaces, to the system, to a sensor platform, to a control unit that is generally a microcontroller, or to a safety semiconductor.

Digital sensors offer the capability, relatively easily implemented in technical terms, of transmitting various faults and malfunction states to the system by way of permanently assigned bits in data words. Each bit has associated with it a fault flag, which in turn is associated with a sensor-internal circuit block or a sensor-internal monitoring variable or measured variable. The sensor-internal monitoring function generally responds when one of the various sensor-internal control voltages or control variables being monitored enters the limits of its respective dynamic range or is beyond design-related value ranges, or when offset values are outside permissible ranges, or when a phase-lock loop drops out of synchronization, or when counters are found to have an overflow or impermissible values. Monitoring is generally performed by way of window comparators or by evaluating the analog/digital converter output or the digital/analog converter input word. There are thus a wide variety of causes in terms of the sensor evaluation circuit function blocks.

Possible causes of malfunction or fault states:

In rotation rate sensors used in automotive systems, vibrational or mechanical disturbance sensitivity is a matter of functional principle and is a characteristic property that must be accounted for in the sensor application. If there is no mechanical damping, the performance of these systems is limited. A mechanical damper assemblage means a considerable additional outlay in terms of development, cost, and production. Impacts or severe vibrations can disrupt the sensor element so much that the sensor-internal control systems can no longer engage for a certain period of time, and the sensor ends up outside its specified functional range. Further possible disturbances are, for example, incoupled electromagnetic interference. Faults in the sensor itself or in the application wiring can likewise impair system operation. The effects differ depending on the rotation rate sensor fault and the kind of disturbance, and also depending on the application environment of the sensor, i.e. the wiring and circuit board and the vehicle construction.

The rotation rate sensor monitoring function has hitherto been used on the system side only for basic fault detection, i.e. is the sensor OK or not. As regards its reaction, the restraint system at most distinguishes by way of the duration of the fault message whether or not a failure of the rotation rate sensor exists. That absent, an application in terms of coordinating the respective system reaction to the various fault messages does not take place.

Since no classification of different fault patterns is performed on the system side, and the application environment also is not incorporated, the principle of "assuming the worst" must be invoked. When the monitoring function identifies a state as faulty, the consequence is that the sensor signal must not be used, or that the system concludes that a permanent sensor fault and therefore a system defect exists. Malfunctions that do not signify lasting sensor damage and are possibly attributable to infrequent but possible operating states are therefore generally punished too severely. This limits the performance or sensitivity of the systems, or increases the probability of a possibly unnecessary control unit field failure.

According to the present invention, a fault pattern that contains the combination of different fault modes is therefore transmitted from the sensor to the system, preferably a processor of the control unit, thus conveying to the system accurate information about the nature and cause of the fault. An appropriate reaction by the system to that fault is then therefore possible.

The fault patterns that occur in response to various fault and malfunction causes are already determined in the development and application phase of restraint system electronics systems. With the availability of a look-up table, the system can react properly to the particular fault pattern.

A practical prerequisite for implementation of the invention is a digital sensor interface. Only with this can a large number of different faults and malfunction modes or patterns, as well as combinations thereof, be transmitted to the system with reasonable outlay. The bidirectional SPI (serial peripheral interface) is used here as an example of an interface. In this context, for example, two instructions RD_MONITOR_I and RD_MONITOR_II are provided for reading out the various fault modes, the modes themselves being identified by way of flags in the MONI word transmitted back in each case. The word having eight zeroes, for example, means here that the monitored sensor parameter is within specified operating ranges, and an unusual operating state does not exist. The following faults can be indicated by coding:

The capacitance/voltage converter in which the measured variable is mapped by way of the sensor principle into a capacitance or a capacitance change is outside its predefined range; the value at the analog/digital converter in the drive path, which is an oscillating sensor, is outside its predefined range; the phase-lock loop is not synchronized; the offset controller is outside its predefined range; the sum value and/or difference value of the common-mode control circuit in the drive circuit and/or in the detection circuit is outside its predefined range; the amplitude of the sensor oscillation is outside its predefined range. The drive circuit of a rotation rate sensor serves to generate a defined (i.e. usually regulated) oscillating or rotational motion with which, in the presence of a rotation rate, a measurable effect (for example, a deflection of a micromechanical structure orthogonally to that motion) is generated using e.g. the principle of conservation of angular momentum. This effect is measured or sensed, and processed, in the detection circuit.

In addition to these fault indications, an unusual operating state can be indicated if the rotation rate value that is present exceeds or falls below the measurement range of the sensor, and the value must be mapped onto the maximum or minimum value that can be represented.

FIG. 1 shows the sensor and the control unit according to the present invention in a block diagram. Located in a control unit 10 is a sensor 1 that is connected via a digital line 6 to a processor 7. Processor 7 is connected via a data input/output to a memory 8. Processor 7 is connected via a data output to the remainder of restraint system 9. A so-called safety semiconductor 5, i.e. a further processor or a monitoring circuit that also evaluates the sensor output values and can influence the enabling of restraint means, can be connected to digital line 6. Located in sensor 1 is a sensor element 2 for acquiring a measured variable, e.g. rotation rates or rotational accelerations. The sensor element can chiefly be a micromechanical sensor structure in which drive and detection occur capacitatively. Sensor element 2 is connected to a functional and monitoring module 3 where capacitance/voltage conversion, analog/digital conversion of the sensor signal, driving and regulation of the sensor oscillation, and sensor-internal monitoring functions can be implemented. Functional and monitoring module 3 is connected via a data output to a transmitter module 4. Transmitter module 4 is connected to digital line 6, which is embodied here as a so-called SPI (serial peripheral interface) line.

Functional and monitoring module 3 thus also performs monitoring functions in sensor 1. The measured values are conveyed to transmitter module 4. At a cycling rate predefined by the sensor circuit timing cycle, the fault patterns are continuously updated and can be continuously queried. The measured values in sensor 1 are incorporated into this fault pattern.

Figure 2:
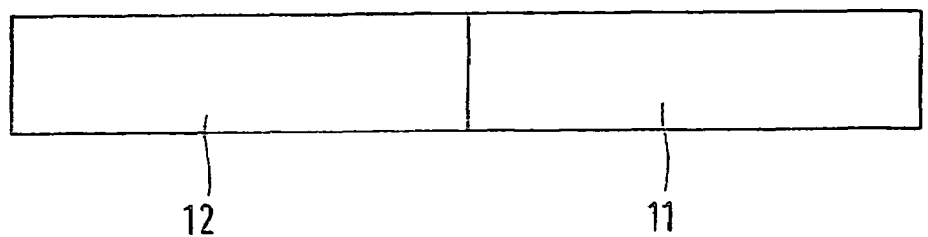
FIG. 2 shows a data telegram according to the present invention.

FIG. 2 schematically shows a data frame of the requested 16-bit MISO word, which is subdivided into a first part 12 and a second part 11. The respective fault word 11 (MONI) is transmitted in second part 11. Two fault words, which can be read out using different MOSI instructions, can be transmitted here. This can occur cyclically or only when necessary. That necessity is indicated in the standard rotation rate transmission by setting a bit that indicates an unusual operating state. That bit is set when at least one indicatable fault instance is deemed to exist.

Sensor 1 can also, alternatively, be located outside control unit 10. Instead of only one sensor 1, several sensors, possibly of different kinds, can also be used and monitored. In addition to the restraint system discussed here, other vehicle systems are also suitable for this invention, for example a vehicle dynamics system or a navigation system.

What is claimed is:

1. A control unit comprising:
    a sensor comprising a sensor element, at least one digital interface, and means for transmitting a fault pattern via the at least one digital interface, wherein the fault pattern is a digital fault pattern comprising individual bits corresponding to different fault flags; and
    a processor that receives at least one signal from the sensor via the at least one digital interface, wherein the at least one sensor signal includes the fault pattern and the processor evaluates the at least one sensor signal as a function of the fault pattern,
    wherein the sensor is configured to respond to two different read instructions, returning a first portion of the fault pattern in response to a first read instruction, and a second portion of the fault pattern in response to a second read instruction, the first portion having bits corresponding to a first plurality of fault flags, the second portion having bits corresponding to a second plurality of fault flags different than the first plurality of fault flags.

2. The control unit according to claim 1, wherein the sensor is disposed inside a housing of the control unit.

3. The control unit of claim 1, wherein each fault flag corresponds to a different sensor-internal monitoring mechanism.

4. The control unit of claim 1, wherein the sensor is configured to transmit exactly one operating state bit with every regular sensor output value transmission, the operating state bit indicating whether at least one fault is detected by the sensor, and
    wherein the operating state bit indicates whether at least one of the two read instructions will return a fault indication.

5. The control unit of claim 1, further comprising: a memory connected to the processor.

6. The control unit of claim 1, further comprising: a data output that is connectable to a restraint system of an automotive system.

7. The control unit of claim 1, further comprising: a monitoring circuit connectable to the digital interface of the sensor for evaluating the at least one sensor signal and influencing the enabling of a restraint arrangement based on the evaluation of the at least one sensor signal.

8. The control unit of claim 1, wherein the sensor element is for acquiring a measured variable.

9. The control unit of claim 8, wherein the sensor further comprises: a functional and monitoring module for performing analog-to-digital conversion of the sensor signal, including the measured variable.

10. The control unit of claim 9, wherein the functional and monitoring module is for monitoring the sensor.

11. The control unit of claim 1, wherein the sensor continuously updates the fault pattern.

12. The control unit of claim 1, wherein the fault pattern includes a value of a measured variable which produced a fault.

13. The control unit of claim 1, wherein the sensor includes a rotation rate sensor for an automotive system.

14. A control unit comprising:
    a sensor comprising a sensor element, at least one digital interface, and means for transmitting a fault pattern via the at least one digital interface, wherein the fault pattern is a digital fault pattern comprising individual bits corresponding to different fault flags, and wherein the sensor is configured to transmit exactly one operating state bit with every regular sensor output value transmission, the operating state bit indicating whether at least one fault is detected by the sensor; and
    a processor that receives at least one signal from the sensor via the at least one digital interface, wherein the at least one sensor signal includes the fault pattern and the processor evaluates the at least one sensor signal as a function of the fault pattern, wherein the sensor is configured to respond to two different read instructions from the processor and return a first portion of the fault pattern in response to a first read instruction and a second portion of the fault pattern in response to a second read instruction, the first portion having bits corresponding to a first plurality of fault flags, the second portion having bits corresponding to a second plurality of fault flags different than the first plurality of fault flags, wherein the operating state bit indicates whether at least one of the two read instructions will return a fault indication.

15. The control unit of claim 1, wherein the first portion includes 8 first bits corresponding to the first plurality of fault flags, and the second portion includes 8 second bits corresponding to the second plurality of fault flags.

16. The control unit of claim 1, wherein the processor is configured to determine a particular action to perform in response to a particular value of the fault pattern by accessing a look-up table relating a plurality of possible values of the fault pattern to a plurality of actions, wherein the look-up table relates each possible value of the fault pattern to at least one of the plurality of actions.

17. The control unit of claim 16, wherein at least some of the plurality of possible actions do not include initiating a sensor replacement process.

18. The control unit of claim 14, wherein the first portion includes 8 first bits corresponding to the first plurality of fault flags, and the second portion includes 8 second bits corresponding to the second plurality of fault flags.

19. The control unit of claim 14, wherein the processor is configured to determine a particular action to perform in response to a particular value of the fault pattern by accessing a look-up table relating a plurality of possible values of the fault pattern to a plurality of actions, wherein the look-up table relates each possible value of the fault pattern to at least one of the plurality of actions.

20. The control unit of claim 19, wherein at least some of the plurality of possible actions do not include initiating a sensor replacement process.

* * * * *